United States Patent
Uchida

(10) Patent No.: US 7,539,226 B2
(45) Date of Patent: May 26, 2009

(54) OPTICAL ELEMENT, METHOD FOR MANUFACTURING OPTICAL ELEMENT AND SEMICONDUCTOR LASER DEVICE USING THE OPTICAL ELEMENT

(75) Inventor: Tatsuro Uchida, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 238 days.

(21) Appl. No.: 11/677,867

(22) Filed: Feb. 22, 2007

(65) Prior Publication Data

US 2008/0031297 A1    Feb. 7, 2008

(30) Foreign Application Priority Data

Feb. 28, 2006    (JP)    .............. 2006-051945

(51) Int. Cl.
*H01S 5/00*    (2006.01)
(52) U.S. Cl. ............. 372/43.01; 372/44.01; 372/46.013
(58) Field of Classification Search .............. 372/43.01, 372/44.01
See application file for complete search history.

(56) References Cited

U.S. PATENT DOCUMENTS 7,042,014 B2 *    5/2006    Sugitatsu et al. .............. 257/79

2006/0245716 A1    11/2006    Uchida ....................... 385/147
2007/0201527 A1    8/2007    Hori et al. .............. 372/50.124

FOREIGN PATENT DOCUMENTS

JP    2000-232258    8/2000
JP    2005156674 A  *  6/2005

* cited by examiner

*Primary Examiner*—Dung T Nguyen
(74) *Attorney, Agent, or Firm*—Fitzpatrick, Cella, Harper & Scinto

(57) ABSTRACT

The present invention provides an optical element which can reliably acquire a difference of refractive indices between a member under a photonic crystal layer and the crystal layer without using such a stacking technique as in conventional processes; a method for manufacturing the optical element; and a semiconductor laser device with the use of the optical element. The optical element has the first layer 500 and the second layer 400 formed on a substrate 100, wherein the second layer includes pores and has a refractive-index periodically changing structure in which a refractive index periodically changes in an in-plane direction; and the first layer has an oxidized region with a lower refractive index than the refractive index of the second layer, in a lower side of the pores of the second layer.

5 Claims, 10 Drawing Sheets

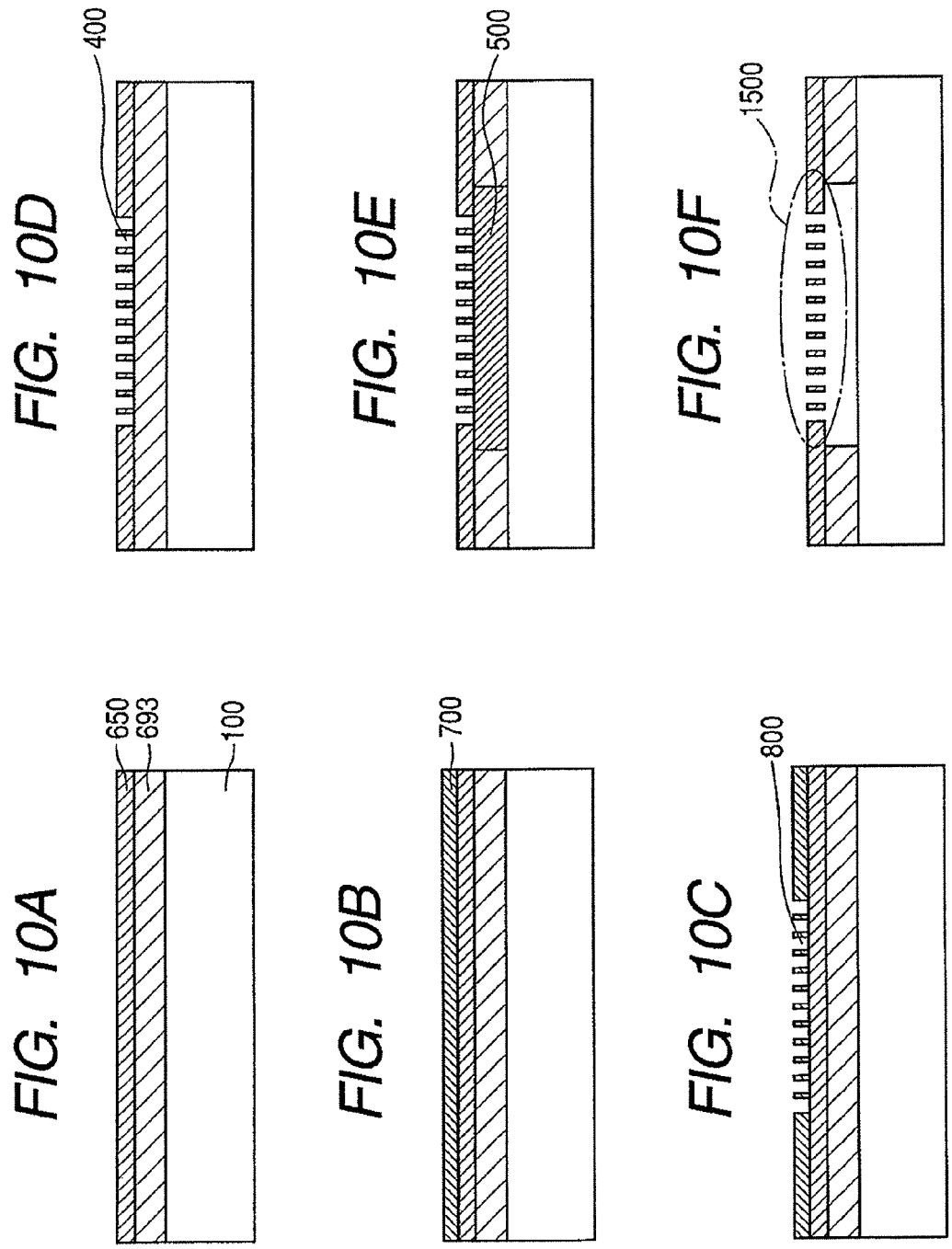

OPTICAL ELEMENT, METHOD FOR MANUFACTURING OPTICAL ELEMENT AND SEMICONDUCTOR LASER DEVICE USING THE OPTICAL ELEMENT

BACKGROUND OF THE INVENTION

1. Field of the Invention

The present invention relates to an optical element, a method for manufacturing the optical element and a semiconductor laser device using the optical element.

2. Description of the Related Art

In recent years, research on a photonic crystal has been actively conducted.

The photonic crystal means a structure which is formed of substances periodically repeating different refractive indices, and thereby causes a wavelength range (photonic band gap) in which light is inhibited from propagating, similarly to a band gap existing in an electronic state of a crystal.

By using the photonic crystal, it becomes possible to two-dimensionally or three-dimensionally confine light in the crystal, so that the photonic crystal is tried to be applied to an optical waveguide or a mirror for a semiconductor laser.

Technologies with the use of various techniques have been proposed in order to produce the two-dimensional and three-dimensional dielectrics with the periodic structure for the photonic crystal. However, the photonic crystal having the two-dimensional periodic structure is more likely to be realized because the structure can be produced with a lithographic technology.

Incidentally, an ideal two-dimensional photonic crystal shall have a uniform and infinite length in a Z-axis direction, but it is practically impossible to produce such a crystal. In addition, when the two-dimensional photonic crystal is long in the Z-axis direction (film thickness direction), light inevitably spreads toward outside of the Z-axis direction. Accordingly, when the two-dimensional photonic crystal is imparted a function such as amplification and absorption, the length brings disadvantage.

For this reason, when the two-dimensional photonic crystal is actually used, it needs to confine the light which propagates in the Z-axis direction, by any means.

Specifically, it is necessary to make a difference between refractive indices of a photonic crystal layer placed on a substrate and the substrate large.

In order to meet such a need, for instance, Japanese Patent Application Laid-Open No. 2000-232258 (Patent Document 1) discloses a technology in FIG. 2 for realizing a slab-type photonic crystal formed of two layers having a large difference of a refractive index between them by combining a semiconductor layer with a dielectric layer while using a stacking technique.

SUMMARY OF THE INVENTION

However, in order to manufacture a slab-type photonic crystal disclosed in Patent Document 1, a high grade of process technology is necessary for the stacking step.

The high grade of the process technology is required specifically because a necessary layer in the stacking step needs to be removed afterwards because the layer is unnecessary for the element, and one epitaxial substrate alone cannot realize the element, which make the process complicated.

The present invention is designed with respect to the above described problem and is directed at providing an optical element which can reliably acquire a difference of refractive indices between a member under a photonic crystal layer and the crystal layer without using such a stacking technique as in conventional processes; a method for manufacturing the optical element; and a semiconductor laser device with the use of the optical element.

In order to achieve the above described object, the present invention provides an optical element having the configuration described below; a method for manufacturing the optical element; and a semiconductor laser device with the use of the optical element.

The present invention is directed to an optical element having a first layer and a second layer formed on a substrate, wherein the second layer includes pores and has a refractive-index periodically changing structure in which a refractive index changes periodically in an in-plane direction; and the first layer has an oxidized region with a lower refractive index than the refractive index of the second layer, in a lower side of the pores of the second layer.

In the optical element, the first layer can include Al.

In the optical element, the difference of refractive indices between the oxidized region and the second layer can be 1.0 or more.

In the optical element, the first layer and the second layer can include Al, Ga and As.

In the optical element, the first layer can comprise the oxidized region and an unoxidized region.

The present invention is directed to a semiconductor laser device comprising the optical element, wherein the optical element is used as a mirror in a surface emitting laser.

The present invention is directed to a method for manufacturing an optical element, comprising the steps of: preparing a member having a first layer on a substrate, and having in the upper part of the first layer a second layer that contains pores and has a refractive-index periodically changing structure in which a refractive index changes periodically in an in-plane direction; and then secondly forming an oxidized region having a lower refractive index than the refractive index of the second layer, by oxidizing a part of the first layer located in a lower part of the pores.

In the method for manufacturing an optical element, the first layer and the second layer can be formed from a compound semiconductor containing Al, and a ratio of Al contained in the first layer is higher than a ratio of Al contained in the second layer.

The method for manufacturing an optical element can comprise a step of removing the oxidized region from the first layer after the step of forming the oxidized region.

The present invention is directed to a method for manufacturing a reflecting mirror to be used in a vertical cavity surface emitting laser, comprising the steps of: preparing a member having the first layer stacked on a substrate and the second layer stacked on the first layer; arraying in the second layer a plurality of pores each of which extends to a stacked direction periodically in the in-plane direction with respect to the substrate; and oxidizing a part of the first layer located in a lower part of the pores to increase a difference of refractive indices between the first layer and the second layer.

The present invention can realize an optical element which can reliably acquire a difference of refractive indices between a member under a photonic crystal layer and the crystal layer without using such a stacking technique as in conventional processes; a method for manufacturing the optical element; and a semiconductor laser device with the use of the optical element.

In other words, the present invention can form a slab-type photonic crystal with a large difference of refractive index even in a semiconductor optical element having a plurality of layers with different compositions, in an easy process; and also can provide a slab-type two-dimensional photonic crystal element which can be applied not only to a passive element but also to an active element such as a laser.

Further features of the present invention will become apparent from the following description of exemplary embodiments with reference to the attached drawings.

BRIEF DESCRIPTION OF THE DRAWINGS

FIGS. 2A, 2B, 2C and 2D are views for describing a slab-type two-dimensional photonic crystal element in Example 1 according to the present invention, in which FIGS. 2A and 2C are views for describing the case of producing a waveguide, and FIGS. 2B and 2D are views for describing the case of producing a resonator.

FIGS. 9A, 9B, 9C and 9D are views for describing a slab-type two-dimensional photonic crystal element provided with an air-bridge structure in Example 4 according to the present invention, in which FIGS. 9A and 9C are views for describing the case of producing a waveguide, and FIGS. 9B and 9D are views for describing the case of producing a resonator.

FIGS. 10A, 10B, 10C, 10D, 10E and 10F are views for describing a method for manufacturing a slab-type two-dimensional photonic crystal element provided with an air-bridge structure in Example 4 according to the present invention.

DESCRIPTION OF THE EMBODIMENTS

An optical element according to the present invention is configured to have such a substrate and a photonic crystal layer provided thereon as to enable the difference of refractive indices between them to be large in order to confine light in the photonic crystal layer, by focusing attention on and making use of the fact that a semiconductor layer located under a photonic crystal layer can be selectively oxidized.

Specifically, the above described optical element is configured so as to have the first layer and the second layer formed on the substrate, wherein the second layer includes pores and has a refractive-index periodically changing structure in which a refractive index periodically changes in an in-plane direction; and the first layer has an oxidized region having a lower refractive index than the refractive index of the second layer, in a lower part of the pores of the second layer.

The optical element having the above described configuration can prevent the photonic crystal layer from bending, when having the oxidized region in the lower part of the photonic crystal including the pores, in comparison with the case of having no oxidized region (specifically, in the case of an air-bridge structure).

Particularly, when the photonic crystal layer including the pores is provided with a protective layer, the oxidized region shows a great effect of preventing the photonic crystal layer from bending.

Furthermore, when a multilayered film including an active layer is prepared in the lower side (substrate side) of the first layer, the oxidized region can block or reduce the ingression of impurities into the multilayered film from the outside.

In addition, when a light-emitting element is produced by using a slab-type two-dimensional photonic crystal element having a configuration of the present invention applied to it, the light-emitting element has advantages described below.

Specifically, the light-emitting element can operate in a single transverse mode with the whole post structure better than a conventional surface emitting laser which operates in a single transverse mode due to a current confinement structure; can emit a laser beam having a larger spot diameter than that of conventional single mode light; and thereby can provide a surface emitting laser having a larger optical output.

Embodiments

In the next place, examples according to the present invention will be described.

EXAMPLE 1

In Example 1, a slab-type two-dimensional photonic crystal element configured by applying the present invention will be described.

In the present example, a slab-type photonic crystal was formed on a GaAs substrate, which includes a selectively oxidized layer of an AlGaAs layer (containing 90% or more Al) used as a clad, and an AlGaAs layer (containing 70% or less Al) used as a core.

Figure 1A:
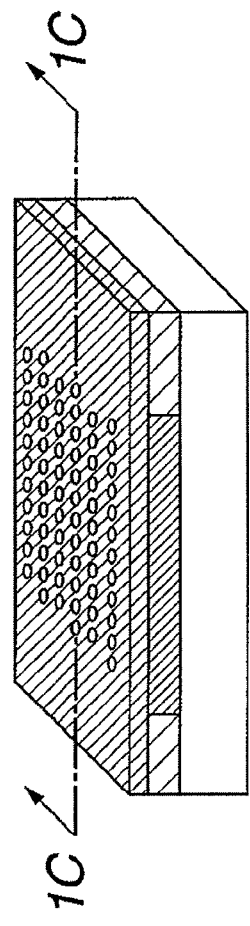
FIGS. 1A, 1B and 1C are schematic views for describing a slab-type two-dimensional photonic crystal element in Example 1 according to the present invention.
Figure 1B:
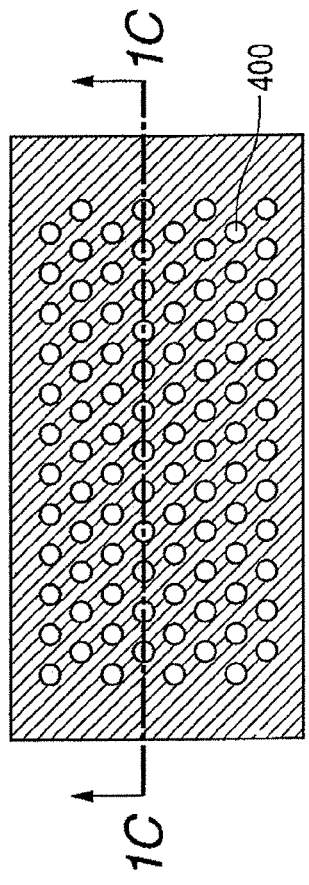
Figure 1C:
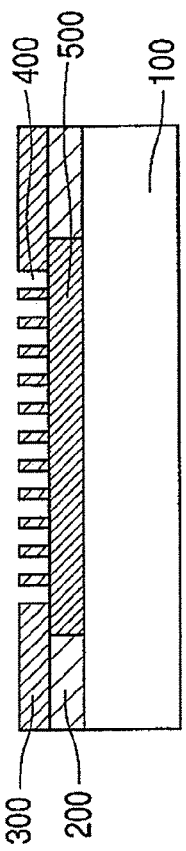

FIGS. 1A to 1C illustrate a configuration of the slab-type two-dimensional photonic crystal element according to the present example.

In FIGS. 1A to 1C, reference numeral 100 denotes the GaAs substrate, reference numeral 200 denotes the $Al_{0.93}Ga_{0.07}As$ layer, reference numeral 300 denotes the $Al_{0.5}Ga_{0.5}As$ layer, reference numeral 400 denotes a cylindrical hole and reference numeral 500 denotes an aluminum oxide layer.

As is illustrated in FIGS. 1A to 1C, a slab-type two-dimensional photonic crystal element produced in the present example includes a GaAs substrate 100; an $Al_{0.93}Ga_{0.07}As$ layer 200 with a thickness of 0.5 μm epitaxially grown thereon; and an $Al_{0.5}Ga_{0.5}As$ layer 300 with a thickness of 0.2 μm epitaxially grown further thereon.

In the $Al_{0.5}Ga_{0.5}As$ layer 300, cylindrical holes 400 penetrating the $Al_{0.5}Ga_{0.5}As$ layer are periodically arrayed into a triangular lattice form.

As illustrated in FIGS. 1A to 1C, in the present example, the $Al_{0.5}Ga_{0.5}As$ layer 300 (refractive index of 3.5) has the periodic structure (in photonic crystal containing cylindrical hole 400) formed therein; contacts with air (refractive index of 1) on its top face; and contacts with the aluminum oxide layer 500 (with refractive index of 1.6) formed by selectively oxidizing the $Al_{0.93}Ga_{0.07}As$ layer 200, in its lower face.

Accordingly, a periodic structure (photonic crystal) formed in the $Al_{0.5}Ga_{0.5}As$ layer 300 (with refractive index of 3.5) functions as a core layer.

Thus, a slab-type two-dimensional photonic crystal element according to the present example can acquire as large a difference of refractive indices between the core layer and clads as about 1.9, though the difference has been about 0.3 in a conventional semiconductor-stacked structure.

Figure 2A:
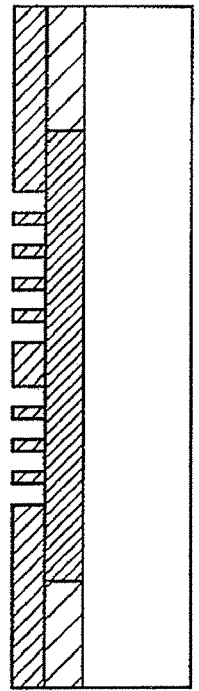
Figure 2B:
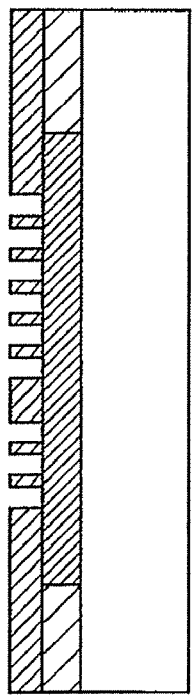
Figure 2C:
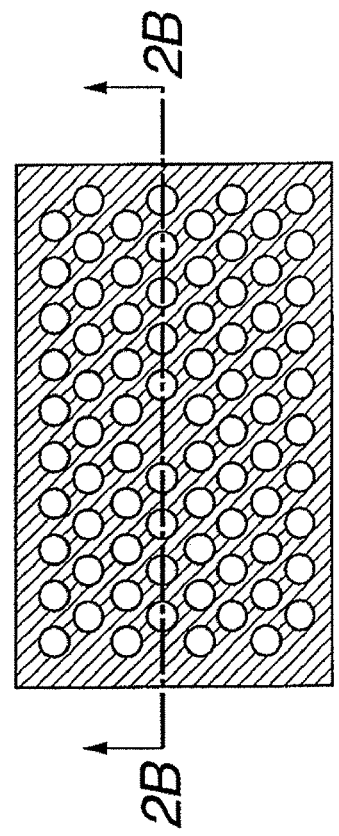
Figure 2D:
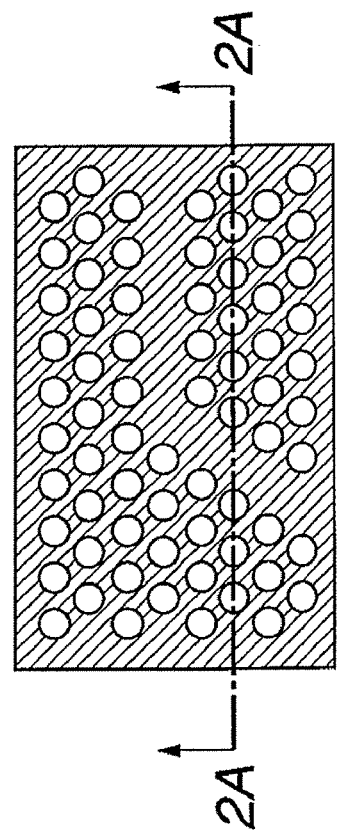

Accordingly, the structure according to the present example enables light to be strongly confined into the core layer, and enables a waveguide with a low optical loss as illustrated in FIGS. 2A and 2C and a resonator with a high Q-factor as illustrated in FIGS. 2B and 2D to be produced.

In the next place, a method for manufacturing a slab-type two-dimensional photonic crystal element according to the present example will be described.

FIGS. 3A to 3E illustrate schematic views for describing the above described manufacturing method according to the present example.

In the views, reference numeral 100 denotes a GaAs substrate; reference numeral 693 denotes an AlGaAs epitaxial layer (containing 93% or more Al); reference numeral 650 denotes an AlGaAs epitaxial layer (containing 50% or less Al); reference numeral 700 denotes a resist layer, reference numeral 800 denotes a resist pattern; reference numeral 400 denotes cylindrical holes; and reference numeral 500 denotes an aluminum oxide layer.

Figure 3D:
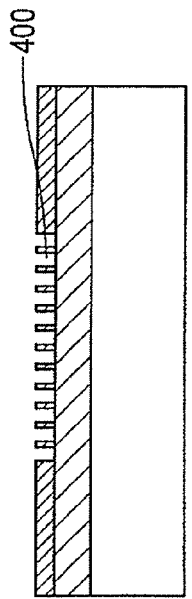
FIGS. 3A, 3B, 3C, 3D and 3E are views for describing a method for manufacturing a slab-type two-dimensional photonic crystal element in Example 1 according to the present invention.
Figure 3E:
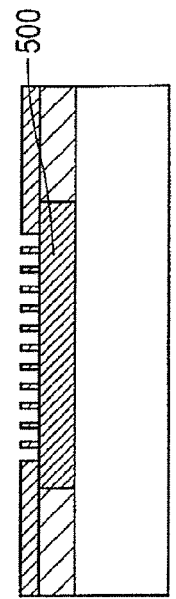
Figure 3A:
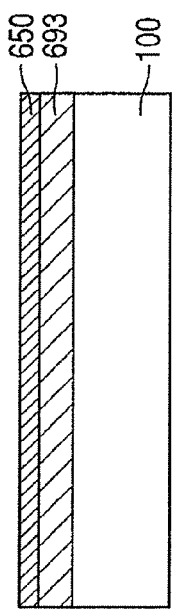
Figure 3B:
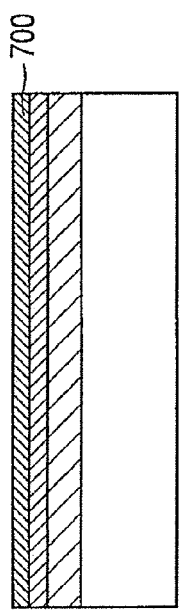
Figure 3C:
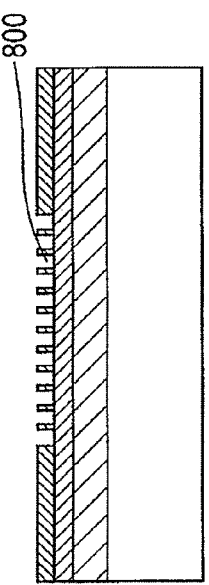

At first as illustrated in FIG. 3A, an $Al_{0.93}Ga_{0.07}As$ layer 693 was grown into the thickness of 0.5 μm on a GaAs substrate 100 through a buffer layer by using an MOCVD apparatus, and then an $Al_{0.5}Ga_{0.5}As$ layer 650 was grown into the thickness of 0.25 μm. Subsequently, as is illustrated in FIGS. 3B and C, a resist pattern 800 was formed on the $Al_{0.5}Ga_{0.5}As$ layer with the use of an electron-beam lithographic technique.

Subsequently, as illustrated in FIG. 3D, the $Al_{0.5}Ga_{0.5}As$ layer was dry-etched deeply until the $Al_{0.93}Ga_{0.07}As$ layer 693 was exposed, by using an ICP etching apparatus.

Subsequently, the resist was removed with an oxygen plasma ashing technique. Through the step, a slab-type two-dimensional photonic crystal (containing cylindrical holes 400 arrayed in triangular lattice) was formed.

Subsequently, an aluminum oxide layer 500 was formed as illustrated in FIG. 3E, by charging thus treated substrate into an oxidizing apparatus (at 450° C., under water vapor atmosphere), and selectively oxidizing one part of the $Al_{0.93}Ga_{0.07}As$ layer 693 through the cylindrical holes formed in the $Al_{0.5}Ga_{0.5}As$ layer 650.

By the above described steps, such a stacked structure of a semiconductor core layer and an oxide film clad layer as to have a larger difference of refractive indices between a core layer and a clad layer than a slab-type two-dimensional photonic crystal having a semiconductor-stacked structure can be easily produced. For instance, a semiconductor-multilayered film structure in one part of which a slab-type two-dimensional photonic crystal is formed can be easily produced.

In the present example, cylindrical holes were periodically arrayed in a triangular lattice form, but the form is not limited thereto. The cylindrical holes may be arrayed into an arbitrary pattern such as a tetragonal lattice and a honeycomb lattice. In addition, the shape of the hole is not limited to the cylindrical shape, but may be an elliptic cylindrical shape, a quadrangular prism shape or a triangular prism shape.

In addition, in the present example, an oxide film with a low refractive index was formed by selectively oxidizing AlGaAs (containing 90% or more Al) in a system AlGaAs (containing 90% or more Al)/AlGaAs (containing 70% or less Al), but it is not limited thereto. A material system which can provide a similar effect (selective oxidation), for instance, an AlN/GaN system may be used.

In addition, techniques (apparatuses) used for growth, lithography, etching and ashing as were shown in the present example are not limited to the described techniques (apparatuses), but any technique (apparatus) is acceptable as long as the apparatus can provide the same effect.

EXAMPLE 2

In Example 2, a surface emitting laser will be described which employs a slab-type two-dimensional photonic crystal element according to the present invention.

Figure 4:
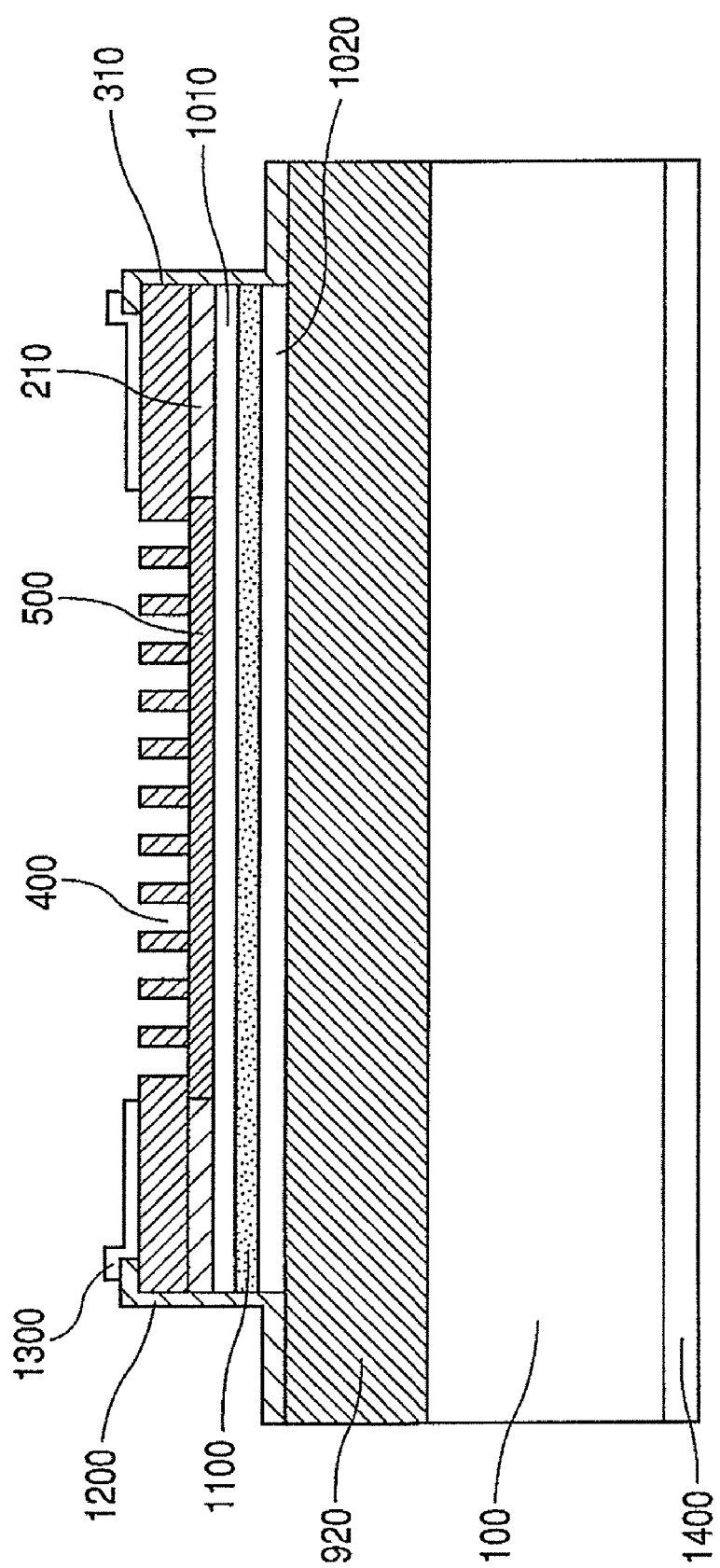
FIG. 4 is a schematic view for describing a surface emitting laser with the use of a slab-type two-dimensional photonic crystal element in Example 2 according to the present invention.

FIG. 4 illustrates a configuration of the above described surface emitting laser according to the present example.

In FIG. 4, reference numeral 100 denotes a GaAs substrate, reference numeral 920 denotes an n-type $Al_{0.93}Ga_{0.07}As/Al_{0.5}Ga_{0.5}As$-DBR mirror layer, and reference numeral 1020 denotes an n-type AlGaInP clad layer.

In addition, reference numeral 1100 denotes a GaInP/AlGaInP multiquantum well active layer, reference numeral 1010 denotes a p-type AlGaInP clad layer and reference numeral 210 denotes a p-type $Al_{0.93}Ga_{0.07}As$ layer.

Furthermore, reference numeral 310 denotes a p-type $Al_{0.5}Ga_{0.5}As$ layer, reference numeral 400 denotes a cylindrical hole, reference numeral 500 denotes an aluminum oxide layer, reference numeral 1200 denotes a silicon nitride layer, reference numeral 1300 denotes an anode and reference numeral 1400 denotes a cathode.

In the present example, a two-dimensional photonic crystal surface emitting laser was produced so that nodes of a standing wave in a resonator could be formed at the center of resonator and each of the interfaces of the active layer and the top and bottom mirrors (DBR mirror and slab-type two-dimensional photonic crystal mirror).

A multiquantum well active layer 1100 was formed on the resonator center so that the gain could match.

In addition, in the present example, the reflecting mirror (DBR mirror) was formed of an $Al_{0.93}Ga_{0.07}As/Al_{0.5}Ga_{0.5}As$ multilayered-film which was formed by alternately stacking a high refractive-index medium with a thickness of a quarter wavelength and a low refractive-index medium with a thickness of a quarter wavelength, and was employed for the first mirror.

The slab-type two-dimensional photonic crystal mirror according to the present example was employed for the second mirror.

A slab-type two-dimensional photonic crystal mirror according to the present example has a periodic structure formed on the top layer of a semiconductor-multilayered film grown on a substrate, and the periodic structure contacts with air on its top face. Specifically, the periodic structure (in photonic crystal containing cylindrical holes arrayed in triangular lattice form) is formed on the $Al_{0.5}Ga_{0.5}As$ layer (with refractive index of 3.5) which is the top layer of the above described semiconductor-multilayered film, and contacts with the air (with refractive index of 1) on its top face.

The periodic structure also contacts with an aluminum oxide layer (with refractive index of 1.6) obtained by selectively oxidizing one part of an $Al_{0.93}Ga_{0.07}As$ layer, at its bottom face.

The slab-type two-dimensional photonic crystal functions as a mirror by making use of an effect referred to as Guided Resonance.

The Guided Resonance means a phenomenon that when light is incident on the slab-type two-dimensional photonic crystal from a direction perpendicular to a slab face, a light having a predetermined frequency is reflected back at an efficiency of nearly 100%. In other words, the Guided Resonance occurs when a mode propagating in the slab-type two-dimensional photonic crystal resonates with a particular radiation mode.

In the next place, a method for manufacturing a surface emitting laser will be described which applies a slab-type two-dimensional photonic crystal element according to the present example for a mirror.

FIGS. 5A to 5I illustrate schematic views for describing the method for manufacturing the above described surface emitting laser according to the present example.

Figure 5A:
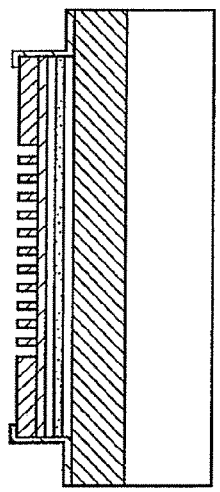
FIGS. 5A, 5B, 5C, 5D, 5E, 5F, 5G, 5H and 5I are views for describing a method for manufacturing a surface emitting laser with the use of a slab-type two-dimensional photonic crystal element in Example 2 according to the present invention.

At first, as illustrated in FIG. 5A, the following respective layers were grown on an n-type GaAs substrate through a buffer layer with the use of a MOCVD apparatus: an n-type $Al_{0.93}Ga_{0.07}As/Al_{0.5}Ga_{0.5}As$-DBR mirror layer, an n-type AlGaInP clad layer, a GaInP/AlGaInP-MQW active layer and a p-type AlGaInP clad layer; and then a p-type $Al_{0.93}Ga_{0.07}As$ layer and a p-type $Al_{0.5}Ga_{0.5}As$ layer.

In the present example, a semiconductor-multilayered film was composed of the above described respective layers which were thus grown.

Figure 5B:
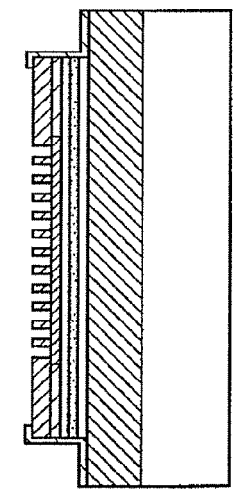
Figure 5C:
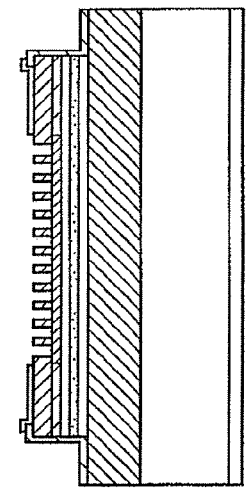

Subsequently, a resist pattern was formed on an $Al_{0.5}Ga_{0.5}As$ layer as illustrated in FIGS. 5B and C, by using an electron-beam lithographic technique.

Figure 5D:
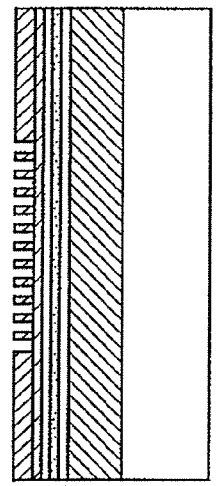

Subsequently, the $Al_{0.5}Ga_{0.5}As$ layer was dry-etched deeply until the $Al_{0.93}Ga_{0.07}As$ layer 920 was exposed as illustrated in FIG. 5D, by using an ICP etching apparatus.

Subsequently, the resist was removed with an oxygen plasma ashing technique. Through the step, a slab-type two-dimensional photonic crystal (containing cylindrical holes arrayed in triangular lattice form) was formed.

Figure 5E:
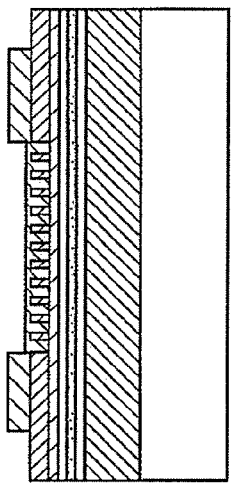

Subsequently, a resist pattern was formed on an $Al_{0.5}Ga_{0.5}As$ layer as illustrated in FIG. 5E, by using a photolithographic technique.

Figure 5F:
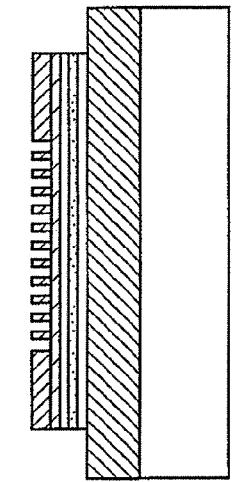
Figure 5G:
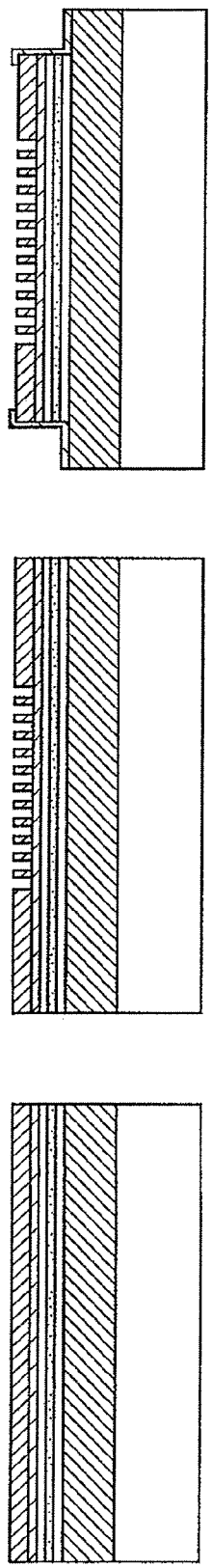

Then, the layers on the n-type $Al_{0.93}Ga_{0.07}As/Al_{0.5}Ga_{0.5}As$-DBR mirror layer was dry-etched until the n-type $Al_{0.93}Ga_{0.07}As/Al_{0.5}Ga_{0.5}As$-DBR mirror layer was exposed as illustrated in FIG. 5F, by using an ICP etching apparatus.

Subsequently, the resist was removed with an oxygen plasma ashing technique. Subsequently, a silicon nitride layer illustrated in FIG. 5G was formed by using a PECVD apparatus.

Then, the periodic structure (photonic crystal containing cylindrical holes) formed on the $Al_{0.5}Ga_{0.5}As$ layer was exposed by using a photolithographic technique, an RIE dry-etching technique and an oxygen plasma ashing technique.

Figure 5H:
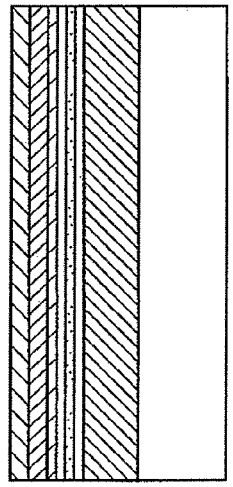

Subsequently, an aluminum oxide layer was formed as illustrated in FIG. 5H, by charging thus treated substrate into an oxidizing apparatus (at 450° C., under water vapor atmosphere), and selectively oxidizing one part of the $Al_{0.93}Ga_{0.07}As$ layer through the cylindrical holes formed in the $Al_{0.5}Ga_{0.5}As$ layer 310.

Figure 5I:
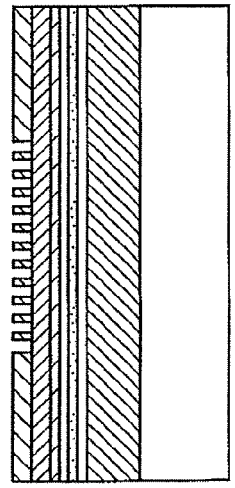

Subsequently, a Ti/Au anode was formed on the $Al_{0.5}Ga_{0.5}As$ layer with the use of a liftoff technique as illustrated in FIG. 5I. In addition, an AuGe/Au cathode was formed on the back face of the GaAs substrate by using an electron-beam vapor deposition technique.

A surface emitting laser having a configuration of using a DBR mirror and a slab-type two-dimensional photonic crystal mirror as a mirror for forming a vertical resonator was obtained by the above described steps.

The surface emitting laser configured so as to use a slab-type two-dimensional photonic crystal according to the present example as the mirror can form a mirror having higher reflectivity than a conventional surface emitting laser, with a single layer.

The slab-type two-dimensional photonic crystal according to the present example can also provide the surface emitting laser having a lower threshold current for causing vibration than a conventional surface emitting laser, because the photonic crystal can decrease the resistance of an element.

In the present example, cylindrical holes were periodically arrayed in a triangular lattice form, but the form is not limited thereto. The cylindrical holes may be arrayed into an arbitrary pattern such as a tetragonal lattice and a honeycomb lattice. In addition, the shape of the hole is not limited to the cylindrical shape, but may be an elliptic cylindrical shape, a quadrangular prism shape or a triangular prism shape.

In addition, in the present example, an oxide film with a low refractive index was formed by selectively oxidizing AlGaAs (containing 90% or more Al) in a system AlGaAs (containing 90% or more Al)/AlGaAs (containing 70% or less Al), but it is not limited thereto. A material system which can provide a similar effect (selective oxidation), for instance, an AlN/GaN system may be used.

In addition, techniques (apparatuses) used for growth, lithography, etching, ashing and vapor deposition as were illustrated in the present example are not limited to the described techniques (apparatuses), but any technique (apparatus) is acceptable as long as the apparatus can provide the same effect.

In addition, in the present example, a resonator structure was configured by an n-type $Al_{0.93}Ga_{0.07}As/Al_{0.5}Ga_{0.5}As$-DBR mirror 920 and a slab-type two-dimensional photonic crystal mirror, but is not limited to the configuration.

The resonator structure may employ the configuration of using the two-dimensional photonic crystal mirror, for instance, as a substitute for the DBR mirror 920 illustrated in FIG. 4.

EXAMPLE 3

In Example 3, a surface emitting laser will be described which employs a slab-type two-dimensional photonic crystal element according to the present invention, but has a different form from that in Example 2.

Figure 6:
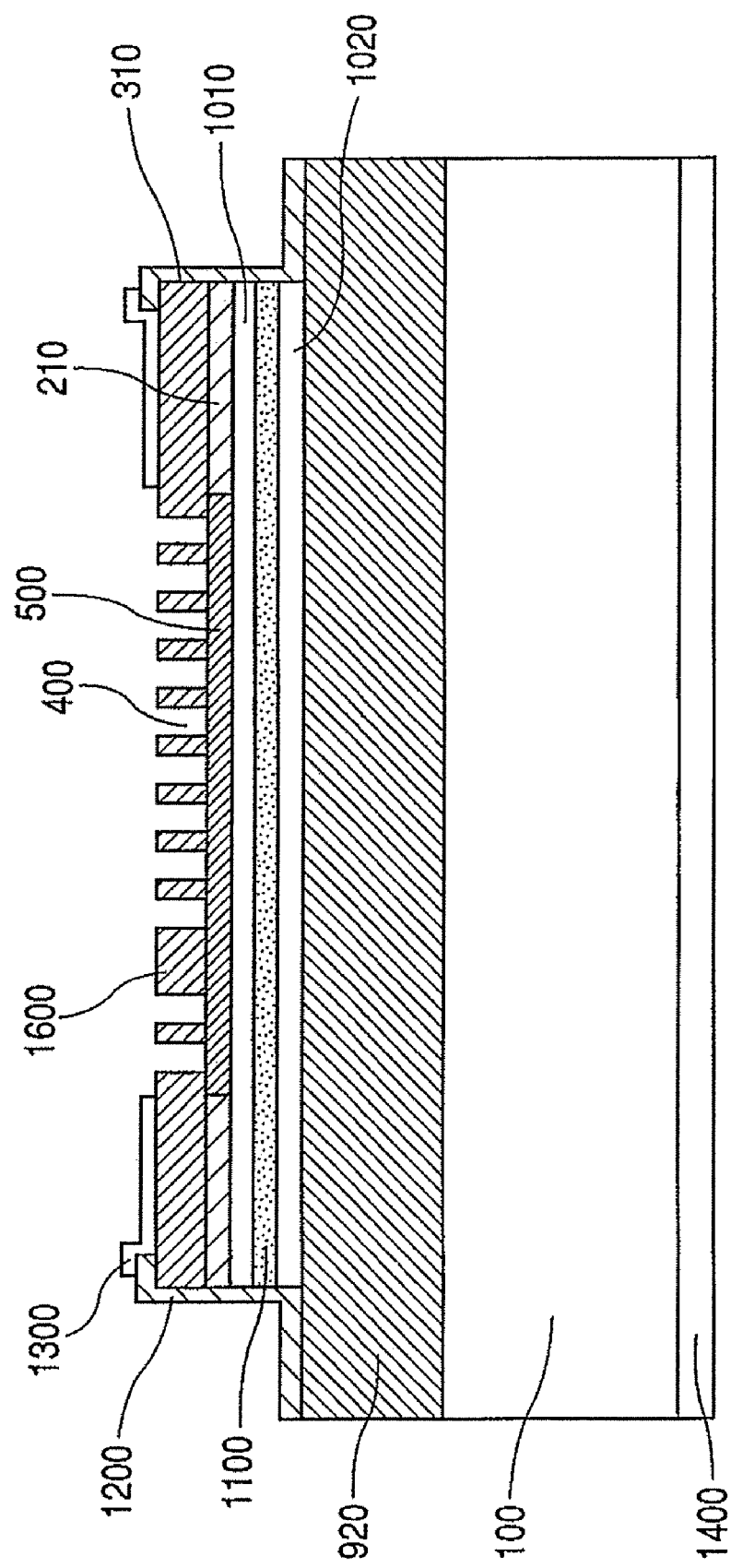
FIG. 6 is a schematic view for describing a surface emitting laser with the use of a slab-type two-dimensional photonic crystal element in Example 3 according to the present invention.

FIG. 6 illustrates a configuration of the above described surface emitting laser according to the present example.

In FIG. 6, reference numeral 100 denotes a GaAs substrate, reference numeral 920 denotes an n-type $Al_{0.93}Ga_{0.07}As/Al_{0.5}Ga_{0.5}As$-DBR mirror layer, and reference numeral 1020 denotes an n-type AlGaInP clad layer.

In addition, reference numeral 1100 denotes a GaInP/AlGaInP multiquantum well active layer, reference numeral 1010 denotes a p-type AlGaInP clad layer, reference numeral 210 denotes a p-type $Al_{0.93}Ga_{0.07}As$ layer, and reference numeral 310 denotes a p-type $Al_{0.5}Ga_{0.5}As$ layer.

Furthermore, reference numeral 400 denotes a cylindrical hole, reference numeral 1600 denotes a defect, reference numeral 500 denotes an aluminum oxide layer, reference numeral 1200 denotes a silicon nitride layer, reference numeral 1300 denotes an anode and reference numeral 1400 denotes a cathode.

In the present example, a two-dimensional photonic crystal surface emitting laser was produced so that nodes of a standing wave in a resonator could be formed at respective borders between a resonator center and an active layer and the top and bottom mirrors (first and second mirrors).

A quantum well active layer 1100 was formed on the resonator center so that the gain could match.

In addition, in the present example, a multilayered-film reflecting mirror was formed by alternately stacking a high refractive-index medium with a thickness of a quarter wavelength and a low refractive-index medium with a thickness of a quarter wavelength, and was employed for the first mirror.

The slab-type two-dimensional photonic crystal mirror having a defect introduced therein according to the present example was employed for the second mirror.

A slab-type two-dimensional photonic crystal mirror according to the present example has a periodic structure formed on the top layer of a semiconductor-multilayered film grown on a substrate, and the periodic structure contacts with air.

Specifically, the periodic structure (in photonic crystal containing cylindrical holes arrayed in triangular lattice form) is formed on the $Al_{0.5}Ga_{0.5}As$ layer (with refractive index of 3.5) which is the top layer of the above described semiconductor-multilayered film formed on the substrate, and contacts with air (with refractive index of 1) on its top face.

The periodic structure also contacts with an aluminum oxide layer (with refractive index of 1.6) obtained by selectively oxidizing one part of an $Al_{0.93}Ga_{0.07}As$ layer, at its bottom face.

The slab-type two-dimensional photonic crystal functions as a mirror by making use of an effect referred to as Guided Resonance.

The Guided Resonance means a phenomenon that when light is incident on the slab-type two-dimensional photonic crystal from a direction perpendicular to a slab face, a light having a predetermined frequency is reflected back at an efficiency of nearly 100%.

In addition, the periodic structure (photonic crystal) formed in the present example has such a site (defect) as to disturb the periodic structure, introduced in its one part.

The surface emitting laser having the defect formed in the two-dimensional photonic crystal can make incident light on a two-dimensional photonic crystal mirror resonate in a wider range in a crystal plane, and can enlarge a spot size of an outgoing beam.

The surface emitting laser can also control an oscillation mode and a polarization mode by changing the shape of the defect.

The surface emitting laser having the configuration can also unify modes into a single mode, because a level is formed in a photonic band by the introduced defect, and incident light on the two-dimensional photonic crystal mirror resonate only in the mode due to the level by the defect in an in-plane direction.

The light which has been united into the single mode is emitted through the defective site in a vertical direction of an incident light side, and resonates between the two top and bottom mirrors (at least one of which a slab-type two-dimensional photonic crystal mirror having the defect) which are formed so as to sandwich an active layer. Thus, the surface emitting laser finally emits the coherent light.

When the spatially localized single-mode lights are emitted, they are united to form a single mode light with a large spot diameter.

In the next place, a method for manufacturing a surface emitting laser will be described which applies a slab-type two-dimensional photonic crystal having a defect introduced therein according to the present example for a mirror.

FIGS. 7A to 7I illustrate schematic views for describing the above described manufacturing method according to the present example.

Figure 7A:
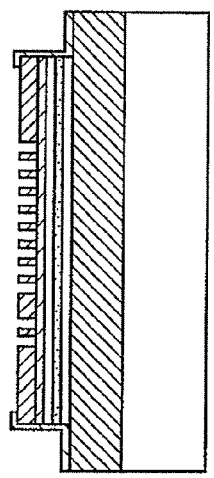
FIGS. 7A, 7B, 7C, 7D, 7E, 7F, 7G, 7H and 7I are views for describing a method for manufacturing a surface emitting laser with the use of a slab-type two-dimensional photonic crystal element in Example 3 according to the present invention.

At first, as illustrated in FIG. 7A, the following respective layers were grown on an n-type GaAs substrate through a buffer layer with the use of a MOCVD apparatus: an n-type $Al_{0.93}Ga_{0.07}As/Al_{0.5}Ga_{0.5}As$-DBR mirror layer, an n-type AlGaInP clad layer, a GaInP/AlGaInP-MQW active layer and a p-type AlGaInP clad layer; and then a p-type $Al_{0.93}Ga_{0.07}As$ layer and a p-type $Al_{0.5}Ga_{0.5}As$ layer.

In the present example, a semiconductor-multilayered film was composed of the above described respective layers which were thus grown.

Figure 7B:
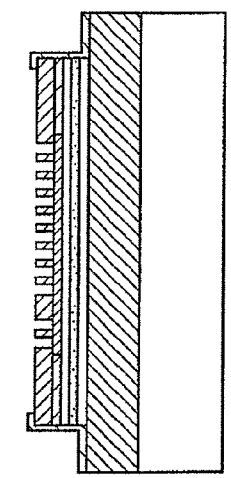
Figure 7C:
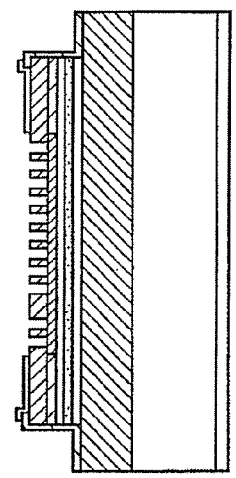

Subsequently, a resist pattern was formed on an $Al_{0.5}Ga_{0.5}As$ layer as illustrated in FIGS. 7B and C, by using an electron-beam lithographic technique.

Figure 7D:
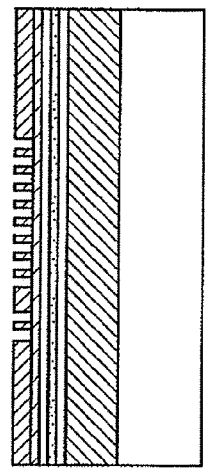

Subsequently, the $Al_{0.5}Ga_{0.5}As$ layer was dry-etched deeply until the $Al_{0.93}Ga_{0.07}As$ layer was exposed as illustrated in FIG. 7D, by using an ICP etching apparatus.

Subsequently, the resist was removed with an oxygen plasma ashing technique.

Through the step, a slab-type two-dimensional photonic crystal (containing cylindrical holes arrayed in triangular lattice form) was formed.

Figure 7E:
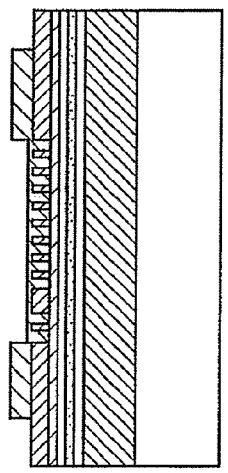

Subsequently, a resist pattern was formed on an $Al_{0.5}Ga_{0.5}As$ layer as illustrated in FIG. 7E, by using a photolithographic technique.

Figure 7F:
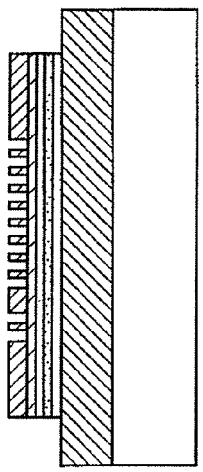
Figure 7G:
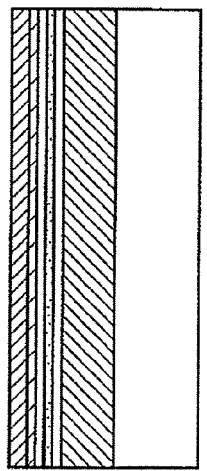

Then, the layers on the n-type $Al_{0.93}Ga_{0.07}As/Al_{0.5}Ga_{0.5}As$-DBR mirror layer was dry-etched until the n-type $Al_{0.93}Ga_{0.07}As/Al_{0.5}Ga_{0.5}As$-DBR mirror layer was exposed as illustrated in FIG. 7F, by using an ICP etching apparatus.

Subsequently, the resist was removed with an oxygen plasma ashing technique. Subsequently, a silicon nitride layer illustrated in FIG. 7G was formed by using a PECVD apparatus.

Then, the periodic structure (photonic crystal containing cylindrical holes) formed on the $Al_{0.5}Ga_{0.5}As$ layer was exposed by using a photolithographic technique, an RIE dry-etching technique and an oxygen plasma ashing technique.

Figure 7H:
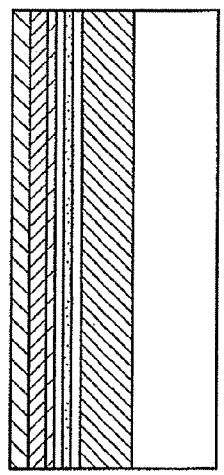

Subsequently, an aluminum oxide layer was formed as illustrated in FIG. 7H, by charging thus treated substrate into an oxidizing apparatus (at 450° C., under water vapor atmosphere), and selectively oxidizing one part of the $Al_{0.93}Ga_{0.07}As$ layer through the cylindrical holes formed in the $Al_{0.5}Ga_{0.5}As$ layer.

Figure 7I:
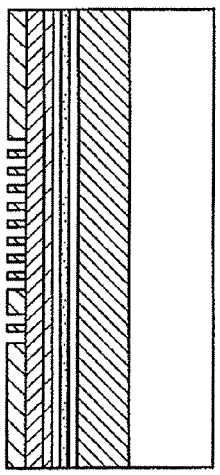

Subsequently, a Ti/Au anode was formed on the $Al_{0.5}Ga_{0.5}As$ layer with the use of a liftoff technique as illustrated in FIG. 7I. In addition, an AuGe/Au cathode was formed on the back face of the GaAs substrate by using an electron-beam vapor deposition technique.

A surface emitting laser having a configuration of using a DBR mirror and a slab-type two-dimensional photonic crystal mirror having a defect introduced therein as a mirror for forming a vertical resonator was obtained by the above described steps.

The surface emitting laser according to the present invention configured so as to use a two-dimensional photonic crystal according to the present example can operate in a single transverse mode due to the whole post structure better than a conventional surface emitting laser which operates in a single transverse mode due to a current confinement structure.

In addition, the surface emitting laser according to the present example can emit a laser beam having a larger spot diameter than that of a conventional single-mode light, and consequently can emit the laser beam with a high optical output.

The two-dimensional photonic crystal surface emitting laser having a post with a diameter of 20 μm produced with a method according to the present example emitted a light having a spot diameter of 15 μm (near field pattern).

The surface emitting laser which uses a slab-type two-dimensional photonic crystal having the configuration according to the present example as the mirror can also form a mirror having higher reflectivity than a conventional surface emitting laser, with a single layer, and accordingly can decrease the resistance of the device. As a result, the surface emitting laser can provide a lower threshold current for causing vibration than a conventional surface emitting laser.

In the present example, cylindrical holes were periodically arrayed in a triangular lattice form, but the form is not limited thereto. The cylindrical holes may be arrayed into an arbitrary pattern such as a tetragonal lattice and a honeycomb lattice. In addition, the shape of the hole is not limited to the cylindrical shape, but may be an elliptic cylindrical shape, a quadrangular prism shape or a triangular prism shape.

In addition, in the present example, an oxide film with a low refractive index was formed by selectively oxidizing AlGaAs (containing 90% or more Al) in a system AlGaAs (containing 90% or more Al)/AlGaAs (containing 70% or less Al), but it is not limited thereto. A material system which can provide a similar effect (selective oxidation), for instance, an AlN/GaN system may be used.

In addition, techniques (apparatuses) used for growth, lithography, etching, ashing and vapor deposition as were illustrated in the present example are not limited to the described techniques (apparatuses), but any technique (apparatus) is acceptable as long as the apparatus can provide the same effect.

In addition, in the present example, a resonator structure was configured by an n-type $Al_{0.93}Ga_{0.07}As/Al_{0.5}Ga_{0.5}As$-DBR mirror 920 and a slab-type two-dimensional photonic crystal mirror having a defect introduced therein, but is not limited to the configuration.

The resonator structure may employ the configuration of using a two-dimensional photonic crystal mirror or the two-dimensional photonic crystal mirror having the defect (not shown), for instance, as a substitute for the DBR mirror 920 illustrated in FIG. 6.

EXAMPLE 4

In Example 4, a slab-type two-dimensional photonic crystal element having an air-bridge structure configured by applying the present invention will be described.

In the present example, one part of an AlGaAs layer (containing 90% or more Al) according to the present invention is selectively oxidized, and only the oxidized layer is further selectively etched. By the above steps, an air-bridge-type slab-type photonic crystal which employs an AlGaAs layer (containing 70% or less Al) for a core is formed on a GaAs substrate.

Figure 8A:
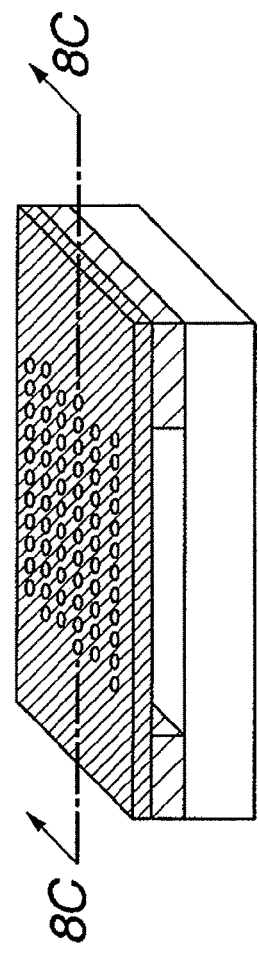
FIGS. 8A, 8B and 8C are schematic views for describing a slab-type two-dimensional photonic crystal element provided with an air-bridge structure in Example 4 according to the present invention.
Figure 8B:
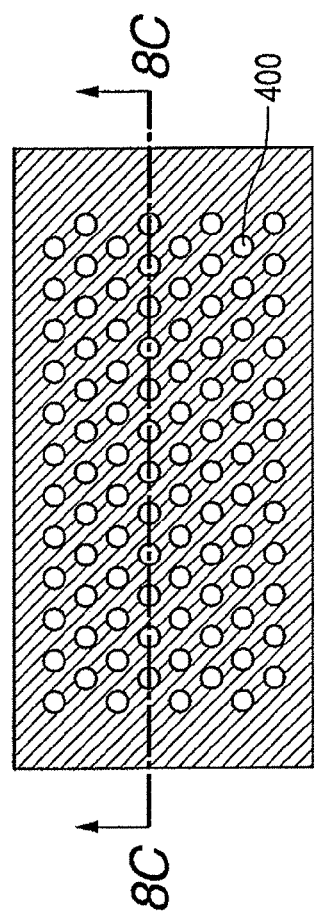
Figure 8C:
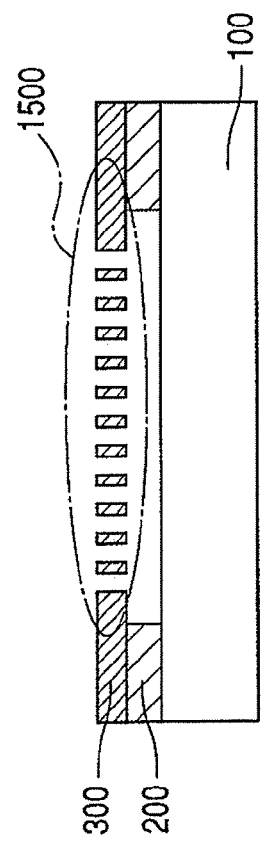

FIGS. 8A to 8C illustrate a configuration of the slab-type two-dimensional photonic crystal element provided with the air-bridge structure according to the present example.

In FIGS. 8A to 8C, reference numeral 100 denotes the GaAs substrate, reference numeral 200 denotes an $Al_{0.93}Ga_{0.07}As$ layer, reference numeral 300 denotes an $Al_{0.5}Ga_{0.5}As$ layer, reference numeral 400 denotes a cylindrical hole and reference numeral 1500 denotes the air-bridge structure.

As is illustrated in FIGS. 8A to 8C, the slab-type two-dimensional crystal element provided with the air-bridge structure according to the present example includes: a GaAs substrate 100; an $Al_{0.93}Ga_{0.07}As$ layer 200 which is epitaxially grown into 0.5 μm on the GaAs substrate 100; and an $Al_{0.5}Ga_{0.5}As$ layer 300 which is epitaxially grown into 0.2 μm further thereon. The $Al_{0.5}Ga_{0.5}As$ layer 300 has cylindrical holes 400 which penetrate the $Al_{0.5}Ga_{0.5}As$ layer and are periodically arrayed into a triangular lattice form.

As illustrated in FIGS. 8A to 8C, in the present example, an $Al_{0.5}Ga_{0.5}As$ layer 300 (with refractive index of 3.5) has a periodic structure (of cylindrical holes 400 in photonic crystal) formed therein and contacts with air (with refractive index of 1) on its top face.

The $Al_{0.5}Ga_{0.5}As$ layer 300 also forms an air-bridge structure 1500 that contacts with the atmospheric layer (with refractive index of 1) at its bottom face, which is formed by selectively removing an aluminum oxide layer (having refractive index of 1.6 but not shown) obtained by selectively oxidizing the $Al_{0.93}Ga_{0.07}As$ layer 200. Thus, the slab-type two-dimensional photonic crystal element having a configuration according to the present example can acquire as large a difference of refractive indices between the core layer and clads as about 2.5, though the difference has been about 0.3 in a conventional semiconductor-stacked structure.

Figure 9A:
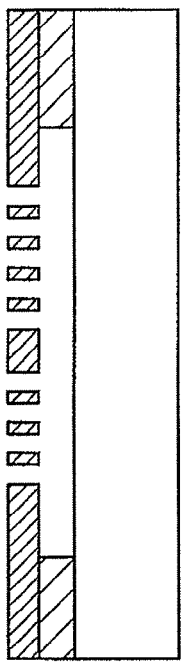
Figure 9B:
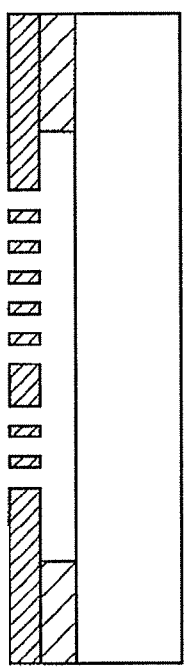
Figure 9C:
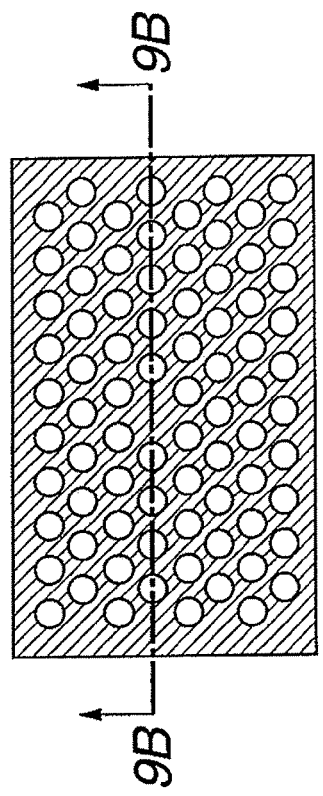
Figure 9D:
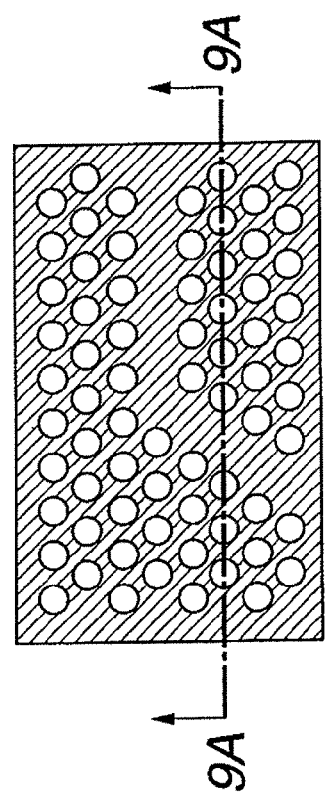

Accordingly, the configuration according to the present example enables light to be strongly confined into the core layer, and enables a waveguide with a low optical loss as illustrated in FIG. 9A and a resonator with a high Q-factor as illustrated in FIG. 9B to be produced.

In the next place, a method for manufacturing a slab-type two-dimensional photonic crystal element provided with the air-bridge structure according to the present example will be described.

FIGS. 10A to 10F illustrate schematic views for describing the above described manufacturing method according to the present example.

In FIGS. 10A to 10F, reference numeral 100 denotes a GaAs substrate, reference numeral 693 denotes an AlGaAs epitaxial layer (containing 93% or more Al), and reference numeral 650 denotes an AlGaAs epitaxial layer (containing 50% or less Al).

In addition, reference numeral 700 denotes a resist layer, reference numeral 800 denotes a resist pattern, reference numeral 400 denotes a cylindrical hole, reference numeral 500 denotes an aluminum oxide layer and reference numeral 1500 denotes an air-bridge structure.

At first, as illustrated in FIG. 10A, an $Al_{0.93}Ga_{0.07}As$ layer 693 was grown into the thickness of 0.5 μm on a GaAs substrate 100 through a buffer layer by using an MOCVD apparatus, and then an $Al_{0.5}Ga_{0.5}As$ layer 650 was grown into the thickness of 0.25 μm. Subsequently, as is illustrated in FIGS. 10B and C, a resist pattern 700 was formed on the $Al_{0.5}Ga_{0.5}As$ layer with the use of an electron-beam lithographic technique.

Subsequently, the $Al_{0.5}Ga_{0.5}As$ layer was dry-etched deeply until the $Al_{0.93}Ga_{0.07}As$ layer was exposed as illustrated in FIG. 10D, by using an ICP etching apparatus.

Subsequently, the resist was removed with an oxygen plasma ashing technique.

Through the step, a slab-type two-dimensional photonic crystal (containing cylindrical holes arrayed in triangular lattice form) was formed.

Subsequently, an aluminum oxide layer 500 was formed as illustrated in FIG. 10E, by charging thus treated substrate into an oxidizing apparatus (at 450° C., under water vapor atmosphere), and selectively oxidizing one part of the $Al_{0.93}Ga_{0.07}As$ layer through the cylindrical holes formed in the $Al_{0.5}Ga_{0.5}As$ layer.

Then, an air-bridge structure 1500 was formed as illustrated in FIG. 10F, by selectively etching the aluminum oxide layer 500 with the use of a buffered fluoric acid solution to form the atmospheric layer.

By the above described steps, such a stacked structure of a semiconductor core layer and an air clad layer as to have a larger difference of refractive indices between the core layer and the clad layer than a slab-type two-dimensional photonic crystal having a semiconductor-stacked structure can be easily produced.

For instance, a semiconductor-multilayered film structure in one part of which a slab-type two-dimensional photonic crystal is formed can be easily produced.

In the present example, cylindrical holes were periodically arrayed in a triangular lattice form, but the form is not limited thereto. The cylindrical holes may be arrayed into an arbitrary pattern such as a tetragonal lattice and a honeycomb lattice. In addition, the shape of the hole is not limited to the cylindrical shape, but may be an elliptic cylindrical shape, a quadrangular prism shape or a triangular prism shape.

In addition, in the present example, an oxide film with a low refractive index was formed by selectively oxidizing AlGaAs (containing 90% or more Al) in a system AlGaAs (containing 90% or more Al)/AlGaAs (containing 70% or less Al), but it is not limited thereto. A material system which can provide a similar effect (selective oxidation), for instance, an AlN/GaN system may be used.

In addition, techniques (apparatuses) used for growth, lithography, etching and ashing as were illustrated in the present example are not limited to the described techniques (apparatuses), but any technique (apparatus) is acceptable as long as the apparatus can provide the same effect.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-051945, filed Feb. 28, 2006, which is hereby incorporated by reference herein in its entirety.

What is claimed is:

1. An optical element comprising a first layer and a second layer formed on a substrate,
    wherein the second layer includes pores and has a refractive-index periodically changing structure in which a refractive index changes periodically in an in-plane direction,
    wherein the first layer has an oxidized region with a lower refractive index than the refractive index of the second layer, in a lower side of the pores of the second layer, and
    wherein the first layer includes the oxidized region and an unoxidized region.

2. The optical element according to claim 1, wherein the first layer includes Al.

3. The optical element according to claim 1, wherein a difference in the refractive indices of the oxidized region and the second layer is 1.0 or more.

4. The optical element according to claim 1, wherein the first layer and the second layer include Al, Ga, and As.

5. The optical element according to claim 1,
    wherein the optical element is incorporated in a semiconductor laser device, and
    wherein the optical element is used as a mirror in a surface emitting laser.

* * * * *